(12) United States Patent
Ryou

(10) Patent No.: US 11,937,382 B2
(45) Date of Patent: *Mar. 19, 2024

(54) SUBSTRATE UNIT AND SUBSTRATE ASSEMBLY, AND CAMERA MODULE USING SAME

(71) Applicant: LG INNOTEK CO., LTD., Seoul (KR)

(72) Inventor: Hyun Woo Ryou, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/152,918

(22) Filed: Jan. 11, 2023

(65) Prior Publication Data

US 2023/0171899 A1    Jun. 1, 2023

Related U.S. Application Data

(63) Continuation of application No. 17/447,254, filed on Sep. 9, 2021, now Pat. No. 11,582,873, which is a
(Continued)

(30) Foreign Application Priority Data

Jul. 30, 2015    (KR) .................. 10-2015-0108006

(51) Int. Cl.
*H05K 3/46*    (2006.01)
*H04N 23/54*    (2023.01)
(Continued)

(52) U.S. Cl.
CPC .......... *H05K 3/4691* (2013.01); *H04N 23/54* (2023.01); *H04N 23/55* (2023.01); *H04N 23/57* (2023.01);
(Continued)

(58) Field of Classification Search
CPC ........ H05K 3/4691; H05K 1/02; H04N 23/54; H04N 23/57; H04N 23/55
(Continued)

(56) References Cited

U.S. PATENT DOCUMENTS

2002/0048157 A1* 4/2002 Lee .................... H05K 1/144
361/784
2006/0141226 A1    6/2006 Takeuchi
(Continued)

FOREIGN PATENT DOCUMENTS

CN         1778101 A       5/2006
CN       203259691 U   * 10/2013
(Continued)

OTHER PUBLICATIONS

International Search Report in International Application No. PCT/KR2016/008178, filed Jul. 27, 2016.
(Continued)

*Primary Examiner* — Andargie M Aychillhum
(74) *Attorney, Agent, or Firm* — Saliwanchik, Lloyd & Eisenschenk

(57) ABSTRACT

The present invention relates to a substrate unit and a substrate assembly, and a camera module using the same. The present invention may comprise: a first substrate part having rigidity; a second substrate part stacked on one surface of the first substrate part and having flexibility; a third substrate part extending outwardly from the second substrate part and having flexibility; and a reinforcing part which is disposed at a portion where the edge portions of the first substrate part and the third substrate part meet, the reinforcing part having a recessed portion which is formed by recessing the first substrate part inwardly so as to inhibit interference between the first substrate part and the third substrate part. The present invention is capable of resolving (Continued)

the interference between a rigid PCB and a flexible PCB and the tearing thereof by providing a reinforcing part in a connection portion of the rigid PCB and the flexible PCB.

10 Claims, 5 Drawing Sheets

Related U.S. Application Data continuation of application No. 16/937,772, filed on Jul. 24, 2020, now Pat. No. 11,172,582, which is a continuation of application No. 16/405,446, filed on May 7, 2019, now Pat. No. 10,765,014, which is a continuation of application No. 15/748,999, filed as application No. PCT/KR2016/008178 on Jul. 27, 2016, now Pat. No. 10,334,743.

(51) Int. Cl.
| | | |
|---|---|---|
| *H04N 23/55* | (2023.01) | |
| *H04N 23/57* | (2023.01) | |
| *H05K 1/02* | (2006.01) | |
| *H05K 1/14* | (2006.01) | |
| *H05K 3/36* | (2006.01) | |

(52) U.S. Cl.
CPC ............ *H05K 1/02* (2013.01); *H05K 1/0281* (2013.01); *H05K 1/14* (2013.01); *H05K 1/147* (2013.01); *H05K 1/144* (2013.01); *H05K 3/365* (2013.01); *H05K 2201/056* (2013.01); *H05K 2201/09163* (2013.01); *H05K 2201/10121* (2013.01)

(58) Field of Classification Search
USPC ....................................................... 361/749
See application file for complete search history.

(56) References Cited

U.S. PATENT DOCUMENTS

| | | |
|---|---|---|
| 2007/0081309 A1 | 4/2007 | Urushibara et al. |
| 2008/0039694 A1 | 2/2008 | Fujimori |
| 2010/0188565 A1* | 7/2010 | Tanaami ................ H04N 23/50 |
| | | 348/E5.026 |
| 2011/0198111 A1 | 8/2011 | Naganuma et al. |
| 2014/0036218 A1 | 2/2014 | Yu |
| 2015/0163937 A1 | 6/2015 | McClatchie et al. |
| 2015/0189137 A1 | 7/2015 | Han et al. |
| 2019/0269022 A1 | 8/2019 | Ryou |

FOREIGN PATENT DOCUMENTS

| | | | | |
|---|---|---|---|---|
| DE | 202010017834 U1 * | 12/2012 | ............. | H01R 12/73 |
| JP | 7-58424 A | 3/1995 | | |
| JP | 2012-069971 A | 4/2012 | | |
| KR | 10-2006-0003887 A | 1/2006 | | |
| KR | 10-2007-0041153 A | 4/2007 | | |
| KR | 10-0730062 B1 | 6/2007 | | |
| KR | 10-2011-0024854 A | 3/2011 | | |

OTHER PUBLICATIONS

Office Action dated Oct. 4, 2018 in U.S. Appl. No. 15/748,999.
Notice of Allowance dated Feb. 7, 2019 in U.S. Appl. No. 15/748,999.
Supplementary European Search Report dated Mar. 14, 2019 in European Application No. 16830823.7.
Office Action dated Nov. 15, 2019 in Chinese Application No. 201680044832.0.
Office Action dated Aug. 9, 2019 in U.S. Appl. No. 16/405,446.
Office Action dated Feb. 18, 2020 in U.S. Appl. No. 16/405,446.
Notice of Allowance dated Apr. 24, 2020 in U.S. Appl. No. 16/405,446.
Office Action dated Nov. 27, 2020 in U.S. Appl. No. 16/937,772.
Notice of Allowance dated Jun. 9, 2021 in U.S. Appl. No. 16/937,772.
Office Action dated Sep. 15, 2021 in Korean Application No. 10-2015-0108006.
European Search Report dated Feb. 10, 2022 in European Application No. 21205655.0.
Notice of Allowance dated Oct. 11, 2022 in U.S. Appl. No. 17/447,254.
Office Action dated Sep. 18, 2023 in Korean Application No. 10-2023-0086132.

* cited by examiner

SUBSTRATE UNIT AND SUBSTRATE ASSEMBLY, AND CAMERA MODULE USING SAME

CROSS-REFERENCE TO RELATED APPLICATIONS

This application is a continuation of U.S. application Ser. No. 17/447,254, filed Sep. 9, 2021; which is a continuation of U.S. application Ser. No. 16/937,772, filed Jul. 24, 2020, now U.S. Pat. No. 11,172,582, issued Nov. 9, 2021; which is a continuation of U.S. application Ser. No. 16/405,446, filed May 7, 2019, now U.S. Pat. No. 10,765,014, issued Sep. 1, 2020; which is a continuation of U.S. application Ser. No. 15/748,999, filed Jan. 30, 2018, now U.S. Pat. No. 10,334,743, issued Jun. 25, 2019; which is U.S. national stage application of International Patent Application No. PCT/KR2016/008178, filed Jul. 27, 2016; which claims priority to Korean Application No. 10-2015-0108006, filed Jul. 30, 2015; all of which are incorporated herein by reference in their entirety.

TECHNICAL FIELD

The teachings in accordance with exemplary and non-limiting embodiments of this invention relate generally to a substrate unit and a substrate assembly, and a camera module using the same, and more particularly, to a substrate unit and a substrate assembly used for vehicular cameras, and a camera module using the same.

BACKGROUND ART

Concomitant with increased demands on driver convenience and safety in automobile industries, situations are that new technologies are variously grafted, and particularly, technologies using cameras are briskly applied by being fused with software technologies. Efforts are required to minimize the size of these cameras in order to be mounted on vehicles.

The vehicular camera is configured with a lens, an internal circuit and a mechanical structure to support the lens and the internal circuit. Thus, in order to reduce the volume the camera, a plurality of PCBs (Printed Circuit Boards) is overlapped in the course of design, and in order to increase the number of layers to allow overlapping the plurality of PCBs, a rigid flexible PCB (RFPCB) has been disclosed where a plurality of rigid PCBs is connected using flexible PCBs and the flexible PCBs are bent, whereby the plurality of rigid PCBs are arranged to be able to be overlapped.

However, inasmuch as the rigid PCBs and flexible PCBs must be disposed within an allowable space in the aspect of vehicular design, there may be generated interference between the rigid PCBs and the flexible PCBs, as the flexible PCBs are bent, and tearing may be also generated at a connected area between the rigid PCBs and the flexible PCBs.

DETAILED DESCRIPTION OF THE INVENTION

Technical Subject

The present invention is provide to solve the abovementioned problems/disadvantages, and it is an object of exemplary embodiments of the present invention to provide a substrate unit and a substrate assembly capable of resolving the interference between a rigid PCB and a flexible PCB, and the tearing thereof by providing a reinforcing part in a connection portion of the rigid PCB and the flexible PCB, and a camera module using the same.

Technical Solution

In one general aspect of the present invention, there is provided a substrate unit, comprising: a first substrate part having rigidity; a second substrate part stacked on one surface of the first substrate part and having flexibility; a third substrate part extending outwardly from the second substrate part and having flexibility; and a reinforcing part which is disposed at a portion where edge portions of the first substrate part and the third substrate part meet, the reinforcing part having a recessed portion which is formed by recessing the first substrate part inwardly so as to inhibit interference between the first substrate part and the third substrate part.

Preferably, but not necessarily, the third substrate part may be disposed at one side of the recessed portion and the other side of the recessed portion may be disposed with a protruding corner part outwardly protruding from the first substrate part, wherein the edge portion where the first substrate part and the third substrate part meet is interposed between a first imaginary extension line extended from the protruding corner part and a second imaginary line parallel with the first imaginary line extended from a bottom surface of the recessed portion.

Preferably, but not necessarily, at least one portion of the recessed portion may be formed with a radius of curvature of 0.3 mm~0.5 mm.

Preferably, but not necessarily, a distance between the protruding corner part and the third substrate part may be 0.5 mm~2.0 mm.

Preferably, but not necessarily, the recessed portion may be recessed at a depth less than 2.0 mm from an external side line of the first substrate part.

Preferably, but not necessarily, the recessed portion may comprise a first lateral part extended from the protruding corner portion by being recessed, a bottom part deeply formed by being connected to the first lateral part, and a rib formed between the first lateral part and the bottom part to have a curvature.

Preferably, but not necessarily, the recessed portion may further comprise a rib having a curvature from an area where the first substrate part meets the third substrate part to a bottom surface of the recessed portion.

Preferably, but not necessarily, the reinforcing part may comprise a rib connecting the first substrate part to the third substrate part.

Preferably, but not necessarily, the rib may have a curvature.

Preferably, but not necessarily, the second substrate part may have a shape corresponding to that of at least a portion of one surface of the first substrate part.

In another general aspect of the present invention, there is provided a substrate assembly, comprising: a plurality of first substrate parts, each having rigidity and disposed in parallel on an imaginary plane surface; a plurality of second substrate parts, each stacked on one surface of each first substrate part and having flexibility; a third substrate part connecting the plurality of second substrate parts and having flexibility; and a reinforcing part disposed at a portion where edge portions of the first substrate part and the third substrate part meet.

In another general aspect of the present invention, there is provided a camera module, comprising: a lens part; a lens driving unit driving the lens part; a substrate assembly mounted with an image sensor converting a light received from the lens part to an electric signal, wherein the substrate assembly comprises: a plurality of first substrate parts, each having rigidity and disposed in parallel on an imaginary plane surface; a plurality of second substrate parts, each stacked on one surface of each first substrate part and having flexibility; a third substrate part connecting the plurality of second substrate parts and having flexibility; and a reinforcing part disposed at a portion where edge portions of the first substrate part and the third substrate part meet.

Advantageous Effects

The present invention can advantageously resolve interference between a rigid PCB and a flexible PCB and a tearing thereof by providing a reinforcing part in a connection portion between the rigid PCB and the flexible PCB.

BEST MODE

Figure 1:
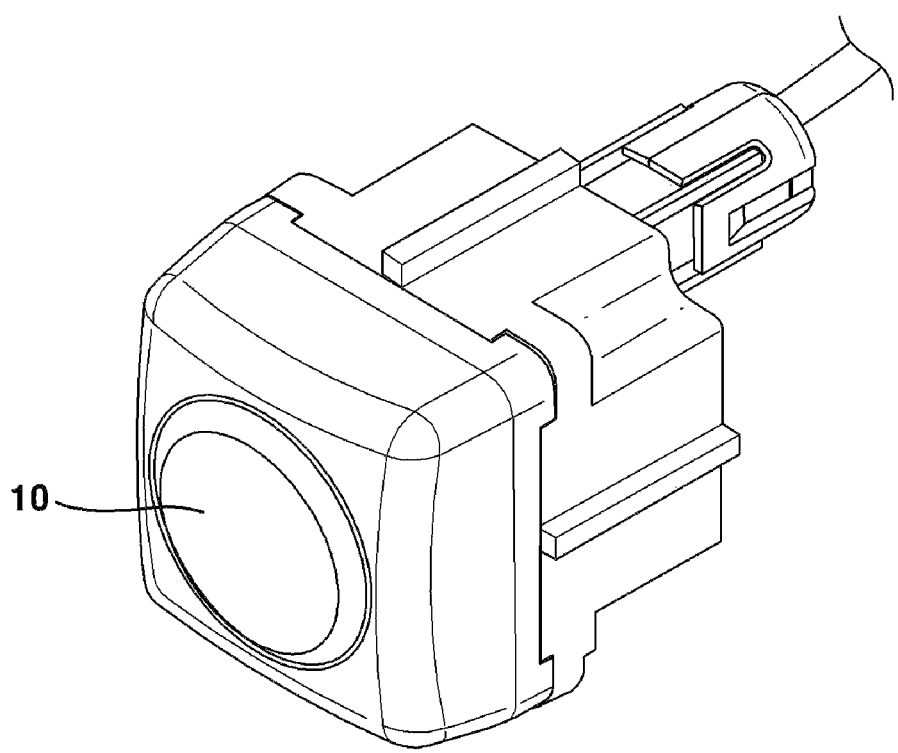
FIG. 1 is a perspective view illustrating a camera module according to an exemplary embodiment of the present invention.

Hereinafter, some of exemplary embodiments of the present invention will be described with reference to the accompany drawings.

Throughout the descriptions, the same reference numerals will be assigned to the same elements in the explanations of the figures, even if shown in different drawings.

Detailed descriptions of well-known functions, configurations or constructions are omitted for brevity and clarity so as not to obscure the description of the present disclosure with unnecessary detail.

Furthermore, the terms "first," "second," "A", "B", (a), (b) and the like, herein do not denote any order, quantity, or importance, but rather are used to distinguish one element from another. In the following description and/or claims, the terms coupled and/or connected, along with their derivatives, may be used. In particular embodiments, connected may be used to indicate that two or more elements are in direct physical and/or electrical contact with each other. "Coupled" may mean that two or more elements are in direct physical and/or electrical contact. However, coupled may also mean that two or more elements may not be in direct contact with each other, but yet may still cooperate and/or interact with each other. For example, "coupled", "joined" and "connected" may mean that two or more elements do not contact each other but are indirectly joined together via another element or intermediate elements.

Hereinafter, a camera module according to an exemplary embodiments of the present invention will be described with reference to the accompany drawings.

Figure 2:
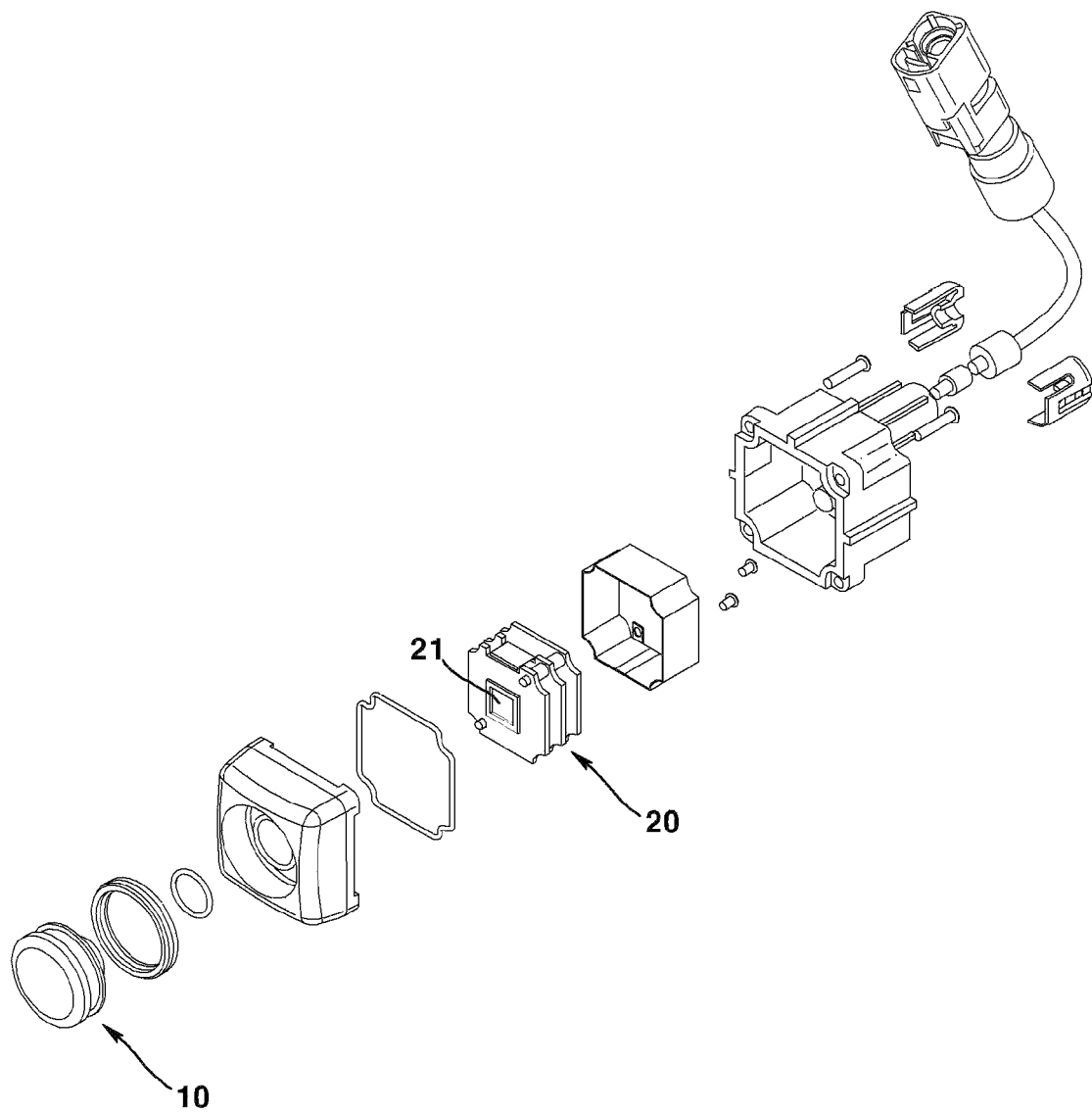
FIG. 2 is an exploded perspective view illustrating a camera module to an exemplary embodiment of the present invention.

FIG. 1 is a perspective view illustrating a camera module according to an exemplary embodiment of the present invention, and FIG. 2 is an exploded perspective view illustrating a camera module to an exemplary embodiment of the present invention.

Referring to FIGS. 1 and 2, the camera module according to an exemplary embodiment of the present invention may comprise a lens part (10) and a lens driving unit (not shown) and a substrate assembly (20), wherein the substrate assembly (20) may be accommodated into a housing (not shown).

Albeit not shown in the drawings, the lens driving unit can drive the lens part (10). Furthermore, the substrate assembly (20) may be mounted with an image sensor (21) converting a light received from the lens part (10) to an electric signal. The explanation of substrate unit will replace an explanation of the substrate assembly (20), because the substrate assembly (20) is formed with one substrate part including a plurality of substrate units (described later), i.e., a rigid flexible PCB.

Figure 3:
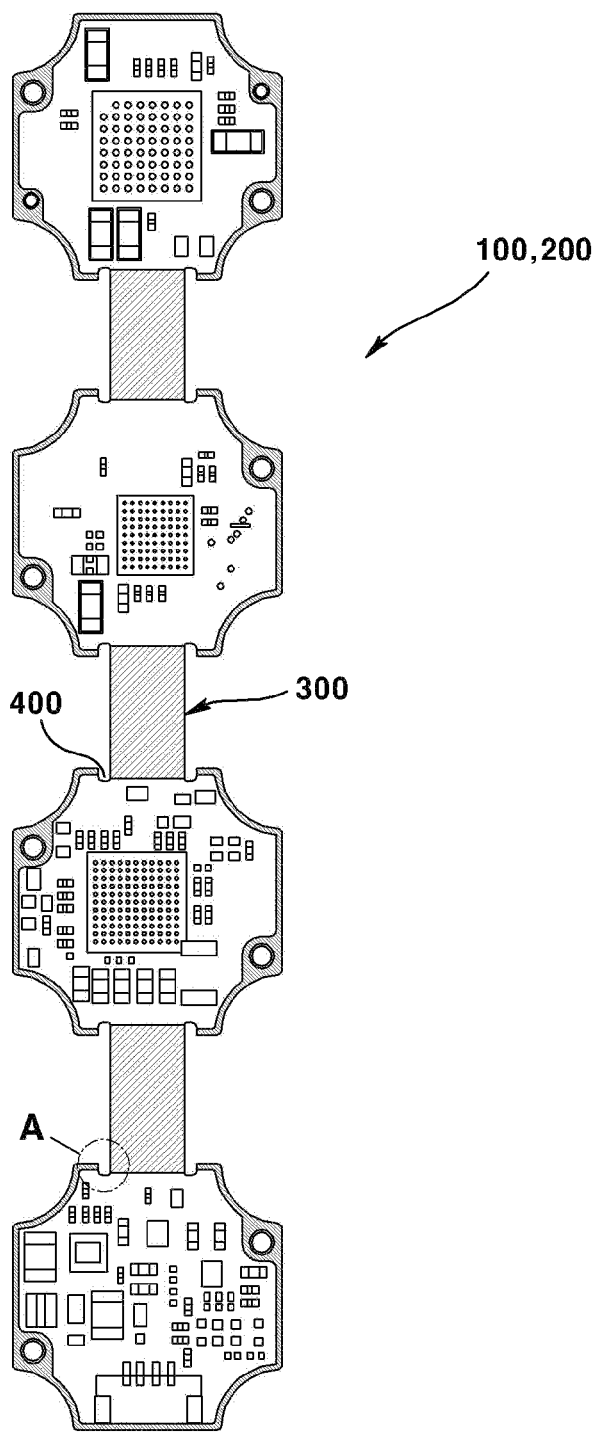
FIG. 3 is a plane view illustrating a substrate unit and a substrate assembly used for a camera module according to an embodiment of the present invention.

FIG. 3 is a plane view illustrating a substrate unit or a substrate assembly (20) used for a camera module according to an embodiment of the present invention.

Referring to FIG. 3, the substrate unit according to an embodiment of the present invention may comprise a first substrate part (100), a second substrate part (200) and a third substrate part (300), and may further comprise a reinforcing part (400).

The first substrate part (100) may take a substantially square shape in order to be accommodated into a housing (not shown) and may have rigidity. In other words, the first substrate part (100) may be preferably formed with a rigid PCB. Furthermore, the first substrate part (100) may be formed at a portion of an external shell with a protruding corner part (420). An imaginary extension line of the protruding corner part (420) may meet a third substrate part (300) where the protruding corner part (420) is spaced apart from the third substrate part (300).

The second substrate part (200) may be stacked on one surface of the first substrate part (100). The second substrate part (200) may have shape corresponding to that of at least one portion of the one surface of the second substrate part (200). In other words, the second substrate part (200) may be stacked on a portion of the first substrate part (100) without being stacked on an entire area of the one surface of the first substrate part (100), as long as the second substrate part (200) is electrically connected to the first substrate part (100).

Furthermore, the second substrate part (200) may have flexibility. That is, the second substrate part (200) is preferably formed with a flexible PCB.

An edge portion of the first substrate part (100) and an edge portion of the second substrate part (200) may be provided with an avoidance part (500) in order to avoid interference with a screw, where the avoidance part (500) may be connected to the protruding corner part (420).

However, although not illustrated in the drawings, the edge portion of the first substrate part (100) and the edge portion of the second substrate part (200) may be formed with a support part (not shown) formed with a through hole (not shown) for passing screw, instead of the avoidance part (500) to allow a substrate unit or a substrate assembly to support the housing, and the edge portion of the first substrate part (100) and the edge portion of the second substrate part (200) may be disposed with the avoidance part (500) and the support part being adjacent to each other.

The third substrate part (300) may be extended to outside from the second substrate part (200). Furthermore, the third substrate part (300) can electrically connect any one part of the first substrate part (100) to another part of the first substrate part (100). Still furthermore, the third substrate part (300) may be preferably formed with a flexible PCB having flexibility to be extended from the second substrate part (200).

The reinforcing part (400) may be disposed at a portion where the first substrate part (100) and the third substrate part (300) meet, and the reinforcing part (400) may inhibit the third substrate part (300) from being damaged. As discussed above, the reinforcing part (400) may comprise a rib (415) connecting the third substrate part (300) with the first substrate part (100), where the rib (415) may have a curvature (see FIGS. 4 to 6).

Figure 4:
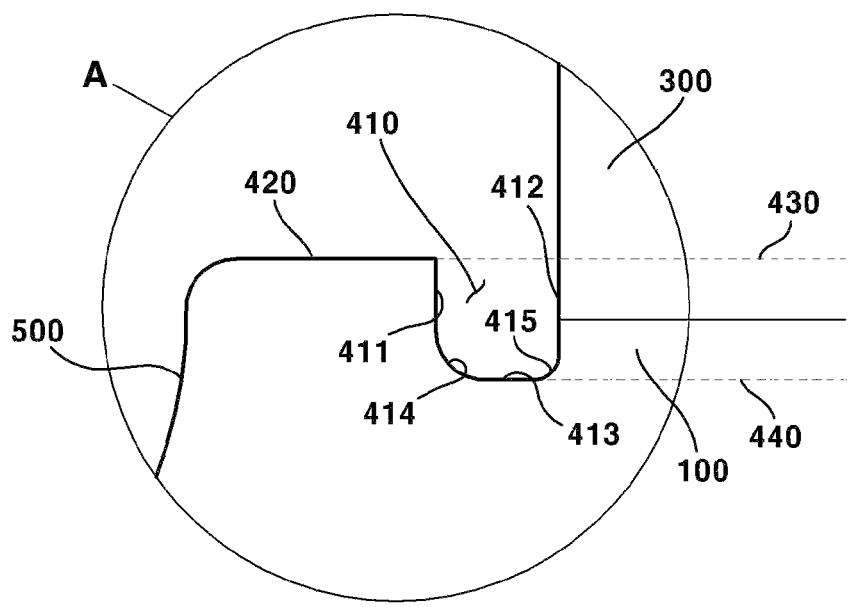
FIG. 4 is an extracted view of "A" part of FIG. 3.

FIG. 4 is an extracted view of "A" part of FIG. 3 that illustrates the reinforcing part (400). The reinforcing part (400) may be disposed at a portion where the first substrate part (100) and the third substrate part (300) meet. Furthermore, the first substrate part (100) may comprise a recessed portion (410) that is inwardly recessed in order to inhibit the first substrate part (100) and the third substrate part (300) from being mutually interfered.

The recessed portion (410) may be so formed as to inhibit a lateral side of the third substrate part (300) from meeting the first substrate part (100) when the third substrate part (300) is bent. At least one portion of the recessed portion (410) may have a curvature and the at least one portion of the recessed portion may be formed with a radius of curvature of 0.3 mm~0.5 mm. The present invention is not limited to a shape for the recessed portion (410).

One side of the recessed portion (410) may be disposed with the third substrate part (300). That is, the third substrate part (300) may be extended from the second substrate part (200) stacked with on the first substrate part (100), and extended from the second substrate part (200) stacked on another first substrate part (100) to be electrically connected to a plurality of first substrate parts (100). That is, the second substrate part (200) may electrically connect a plurality of first substrate parts (100). The recessed portion (410) may comprise a first lateral part (411), a bottom part (413) and a rib (414).

The other side of the recessed portion (410) may be disposed with a protruding corner portion (420) protruding to outside of the first substrate part (100), and a portion where the first substrate part (100) and the third substrate part (300) meet may be disposed between a first imaginary line (430) extended from the protruding corner portion (420) and a second imaginary line (440) extended from the bottom part (413) of the recessed portion (410) and parallel with a first extended line (430).

The recessed portion (410) may be such that a distance between the protruding corner portion (420) and the third substrate part (300) is preferably of 0.5 mm~2. 0 mm. However, the distance may be variably formed depending on a user's intention. Furthermore, the depth of the recessed portion (410), i.e., a distance between the protruding corner portion (420) and the bottom part (413), may be less than 2.0 mm.

The first lateral part (411) may be connected from the protruding corner part (420) on the first substrate part (100), recessed and extended. The bottom part (413) may be connected to the first lateral part (411) to be deeply formed. The rib (414) may be disposed at a portion where the first lateral part (411) and the bottom part (413) meet, and may have a curvature. The radius of curvature at the rib (414) may be preferably 0.3 mm~0.5 mm.

The recessed portion (410) may further comprise a rib (415) having a curvature from a portion where the first substrate part (100) and the third substrate part (300) meet to the bottom part (413) of the recessed portion (410). That is, a rib (415) may be formed that has a curvature from a second lateral part (412) formed at one side of the third substrate part (300) to the bottom part (413), and in this case, the radius of curvature may be preferably 0.3 mm~0.5 mm.

When the radius of curvature of the rib (414, 415) at the recessed portion (410) is formed to be less than 0.3 mm, interference between the first substrate part (100) and the third substrate part (300) may be reduced, but tearing may be generated, and when the radius of curvature of the rib (414, 415) at the recessed portion (410) is formed to be greater than 0.5 mm, the tearing of the first substrate part (100) and the third substrate part (300) may be reduced but the interference may be generated. Although it is preferable that the radiuses of curvature of the ribs (414, 415) be same, the radiuses of curvature of the ribs (414, 415) be different, and may be variably formed, depending on the user's intention without being limited to any particular one.

Figure 5:
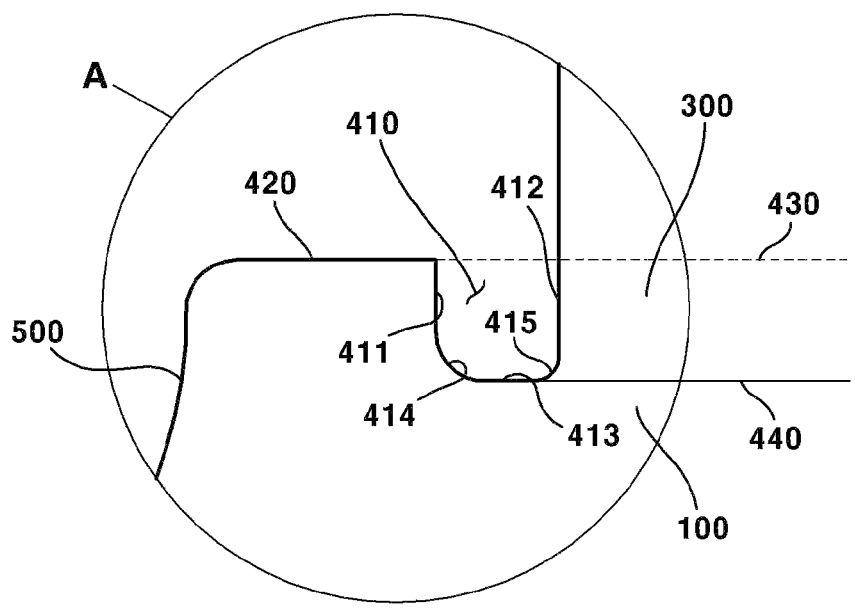
FIG. 5 is an extracted view of "A" part of FIG. 3 according to another exemplary embodiment of FIG. 4.

FIG. 5 is an extracted view of "A" part of FIG. 3 that illustrates a modification of the reinforcing part (400) at FIG. 4.

Referring to FIG. 5, a border between the first substrate part (100) and the third substrate part (300) may match a line imaginarily extended from the bottom part (413) of the recessed portion (410). That is, the protruding corner portion (420) of the recessed portion (410) may be protrudingly formed as much as a depth of the bottom part over the border between the first substrate part (100) and the third substrate part (300). In other words, the border between the first substrate part (100) and the third substrate part (300) may be disposed on an imaginary extension line of the bottom part (413) not interfered with the second lateral part (412).

Figure 6:
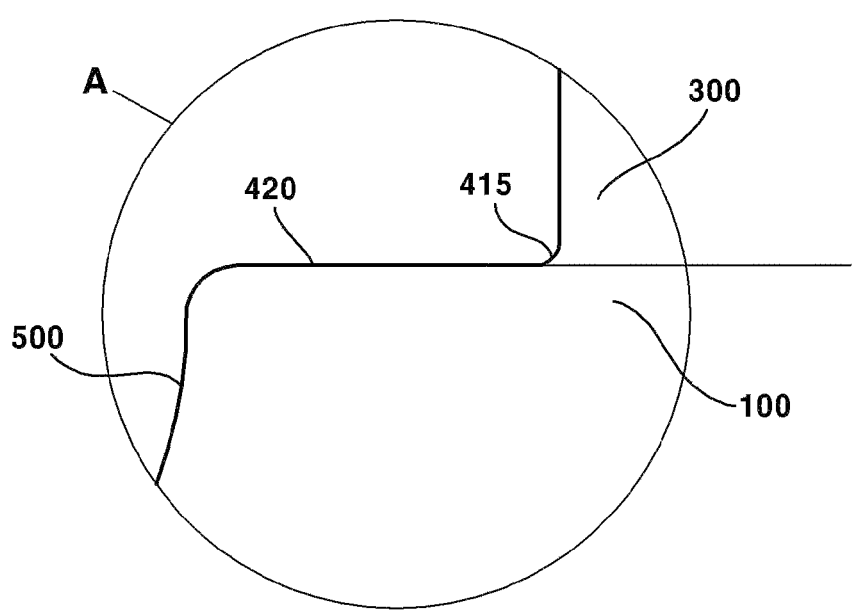
FIG. 6 is an extracted view of "A" part of FIG. 3 according to still another exemplary embodiment of FIG. 4.

FIG. 6 is an extracted view of "A" part of FIG. 3 according to still another exemplary embodiment of FIG. 4 that illustrates a modification of the reinforcing part (400) at FIG. 4.

Referring to FIG. 6, the reinforcing part (400) may not be formed with the recessed portion (410), and the reinforcing part (400) may comprise a rib (415) near the border between the first substrate part (100) and the third substrate part (300). That is, the third substrate part (300) may comprise a rib (415) formed at the edge part with a curvature toward the protruding corner portion (420) of the first substrate part (100). In other words, the border between the first substrate part (100) and the third substrate part (300) may be disposed at an imaginary extension line of the protruding corner portion (420).

Now, referring to FIGS. 4 to 6, albeit the second substrate part (200) not being illustrated, the second substrate part (200) may be understood as having a shape corresponding to that of the first substrate part (100), as being stacked on the first substrate part (100) and extended to the third substrate part (300).

The exemplary embodiments or modifications discussed above are mere examples, and are not limited to the contents mentioned above, and may have various changes depending on a manufacturers' intentions.

A substrate assembly (20) may be formed by connecting the substrate units in a plural number according to the hitherto-mentioned exemplary embodiments. That is, in order to implement the camera module according to the exemplary embodiments of the present invention, the camera module may be accommodated therein with the substrate assembly (20) formed with a plurality of substrate units.

In other words, the substrate assembly (20) may comprise a plurality of first substrate parts (100) having rigidity and arranged in parallel on an imaginary plane, a plurality of second substrate parts (200) stacked on each one surface of the plurality of first substrate parts (100) and having flexibility, a third substrate part (300) connecting the plurality of second substrate parts (200) and having flexibility, and a reinforcing part (400) disposed at a portion where the first substrate part (100) and the third substrate part (300) meet and inhibiting the third substrate part (300) from being damaged.

Although the abovementioned embodiments are merely exemplary in order to implement a substrate unit, a substrate assembly and a camera module using the same according to the present invention, the embodiments are, however, intended to be illustrative only, and thereby do not limit the scope of protection of the present invention.

Thereby, it should be appreciated by the skilled in the art that changes, modifications and amendments to the above examples may be made without deviating from the scope of protection of the invention.

The invention claimed is:

1. A camera module, comprising:
a housing;
a lens part coupled to the housing; and
a substrate assembly disposed in the housing,
wherein the substrate assembly comprises a first printed circuit board, a second printed circuit board, and a flexible printed circuit board disposed between the first printed circuit board and the second printed circuit board,
wherein the first printed circuit board comprises a first coupling hole and the second printed circuit board comprises a second coupling hole coupled to the first coupling hole,
wherein the first coupling hole and the second coupling hole are aligned and coupled to each other by a screw,
wherein the first printed circuit board comprises four avoidance parts formed at four corners, respectively, of the first printed circuit board, and
wherein each of the four avoidance parts is formed concave inwardly and with a curved perimeter.

2. The camera module of claim 1, wherein the first printed circuit board comprises a third coupling hole and the second printed circuit board comprises a fourth coupling hole coupled to the third coupling hole,
wherein the first coupling hole is disposed closer to the flexible printed circuit board than is the third coupling hole, and
wherein the second coupling hole is disposed closer to the flexible printed circuit board than is the fourth coupling hole.

3. The camera module of claim 1,
wherein the first coupling hole is disposed adjacent to a first avoidance part of the four avoidance parts.

4. The camera module of claim 3, wherein the first avoidance part is disposed closer to the flexible printed circuit board than is the first coupling hole.

5. The camera module of claim 1, wherein the first printed circuit board comprises a first surface where the flexible printed circuit board is disposed, and
wherein a first avoidance part of the four avoidance parts extends from an edge of the first surface and a second surface extending from an edge of the first avoidance part.

6. The camera module of claim 5, wherein the first surface comprises a first lateral surface, a second lateral surface overlapping the flexible printed circuit board, and a recess formed on the first lateral surface,
wherein the second lateral surface is disposed further inward than the first lateral surface, and
wherein the second lateral surface is disposed further outward than a bottom surface of the recess.

7. The camera module of claim 6, wherein the recess comprises a first lateral part connected to the first lateral surface and facing the flexible printed circuit board,
wherein the recess comprises a first rib connecting the first lateral part of the recess and the bottom surface of the recess, and
wherein the first rib of the recess is formed in a round shape.

8. The camera module of claim 7, wherein the recess comprises a second lateral part facing the first lateral part of the recess, and a second rib connecting the bottom surface of the recess and the second lateral part of the recess,
wherein the second rib of the recess is formed in a round shape.

9. The camera module of claim 8, wherein a curvature of the first rib is different from a curvature of the second rib.

10. The camera module of claim 1, wherein the first printed circuit board is a rigid printed circuit board.

* * * * *